United States Patent
Yang et al.

(10) Patent No.: US 9,847,488 B2
(45) Date of Patent: Dec. 19, 2017

(54) OLED DISPLAY DEVICE AND FABRICATION METHOD THEREOF, DISPLAY PANEL AND DISPLAY DEVICE

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Feng Bai, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 15/101,761

(22) PCT Filed: Oct. 21, 2015

(86) PCT No.: PCT/CN2015/092394
§ 371 (c)(1),
(2) Date: Jun. 3, 2016

(87) PCT Pub. No.: WO2016/206254
PCT Pub. Date: Dec. 29, 2016

(65) Prior Publication Data
US 2017/0200890 A1    Jul. 13, 2017

(30) Foreign Application Priority Data

Jun. 24, 2015    (CN) .......................... 2015 1 0355125

(51) Int. Cl.
*H01L 21/00*    (2006.01)
*H01L 51/00*    (2006.01)
(Continued)

(52) U.S. Cl.
CPC ........ *H01L 51/003* (2013.01); *H01L 27/3206* (2013.01); *H01L 51/0013* (2013.01);
(Continued)

(58) Field of Classification Search
CPC ............. H01L 27/3211; H01L 27/3206; H01L 51/003; H01L 51/0031; H01L 51/5012; H01L 51/5056
See application file for complete search history.

(56) References Cited

U.S. PATENT DOCUMENTS

| 7,754,520 B2 * | 7/2010 | Lee ..................... H01L 51/0013 257/40 |
| 2009/0203285 A1 * | 8/2009 | Kobayashi .......... H01L 27/3211 445/58 |

(Continued)

FOREIGN PATENT DOCUMENTS

| CN | 101111108 A | 1/2008 |
| CN | 102856327 A | 1/2013 |
| CN | 104882569 A | 9/2015 |

OTHER PUBLICATIONS

Mar. 24, 2016—(WO)—International Search Report and Written Opinion Appn PCT/CN2015/092395 with English Tran.

*Primary Examiner* — Syed Gheyas
(74) *Attorney, Agent, or Firm* — Banner & Witcoff, Ltd.

(57) ABSTRACT

An OLED display device and fabrication method thereof, a display panel and a display device are provided, and the method includes: providing a substrate having an anode layer and a hole injection layer; providing a first molding substrate and a second molding substrate, with a first cavity block being formed on the first molding substrate and a second cavity block being formed on the second molding substrate by a micro mechanical electro system technology, wherein the first cavity block is configured for preparing a hole transport layer corresponding to a sub-pixel of the pixel unit, and the second cavity block is configured for preparing an organic light emitting layer corresponding to a sub-pixel of the pixel unit; filling the first cavity block with a solution of a hole transport material by soaking technology, solidifying to obtain a hole transport layer, and filling the second
(Continued)

cavity block with a solution of an organic light emitting material by soaking technology, solidifying to obtain an organic light emitting layer; transferring the hole transport layer in the first cavity block and the organic light emitting layer in the second cavity block to the substrate sequentially through a transfer carrier; after the above operations, forming an electron transport layer, an electron injection layer and a cathode layer on the substrate.

10 Claims, 3 Drawing Sheets

(51) Int. Cl.
    *H01L 27/32*     (2006.01)
    *H01L 51/52*     (2006.01)
    *H01L 51/50*     (2006.01)

(52) U.S. Cl.
    CPC ...... *H01L 51/5008* (2013.01); *H01L 51/5265* (2013.01); *H01L 51/5012* (2013.01); *H01L 51/5056* (2013.01)

(56) References Cited

U.S. PATENT DOCUMENTS

| | | | |
|---|---|---|---|
| 2013/0000829 A1* | 1/2013 | Carmi | B32B 7/06 |
| | | | 156/230 |
| 2015/0001495 A1* | 1/2015 | Choung | C23C 14/048 |
| | | | 257/40 |
| 2015/0140289 A1* | 5/2015 | Ferro | G03F 7/0046 |
| | | | 428/195.1 |

* cited by examiner

OLED DISPLAY DEVICE AND FABRICATION METHOD THEREOF, DISPLAY PANEL AND DISPLAY DEVICE

The application is a U.S. National Phase Entry of International Application No. PCT/CN2015/092394 filed on Oct. 21, 2015, designating the United States of America and claiming priority to Chinese Patent Application No. 201510355125.0 filed on Jun. 24, 2015. The present application claims priority to and the benefit of the above-identified applications and the above-identified applications are incorporated by reference herein in their entirety.

TECHNICAL FIELD

Embodiments of the present disclosure relate to an OLED display device and a fabrication method thereof, a display panel and a display device.

BACKGROUND

Organic light emitting diode (OLED) display device is an apparatus which drives an organic semiconductor thin film to emit light by electric current, and the apparatus has a laminated structure composed of an anode, a hole injection layer, a hole transport layer, a light emitting layer, an electron transport layer, and a cathode. Under the action of the external electric field, electrons and holes are injected into the organic light emitting layer, and then are compounded in the light emitting layer to form excitons, the excitons are radiative decayed to emit light. OLED display is regarded as a promising generation of display technology for its characteristics of high contrast, high brightness, self-luminescence, wide color gamut and portable.

Active matrix organic light emitting diode (AMOLED) display device is a kind of OLED display device. The R/G/B type AMOLED display device is a pixel unit comprising an R/G/B sub-pixel. The R/G/B sub-pixel of the AMOLED display device can be formed using the fine metal shadow mask (FMM) technology. However, currently it is impossible to form a finer FMM, therefore correspondingly the fine degree of the AMOLED display device prepared by the FMM technology is low, which leads to the resolution of the display panel of the AMOLED display device prepared by the FMM technology is low. Although the fine degree of the AMOLED display device can be improved by the design of white OLED cooperating with color filter, the color filter will reduce the light transmittance, so the luminance of the AMOLED display device prepared by the method is greatly reduced.

SUMMARY

Embodiments of the present disclosure provide a fabrication method of an organic light emitting diode (OLED) display device, the OLED display device corresponds to a pixel unit, and the method comprises: providing a substrate having an anode layer and a hole injection layer; providing a first molding substrate and a second molding substrate, with a first cavity block being formed on the first molding substrate and a second cavity block being formed on the second molding substrate by a micro electro mechanical system (MEMS) technology, wherein, the first cavity block is configured for preparing a hole transport layer corresponding to a sub-pixel of the pixel unit, and the second cavity block is configured for preparing an organic light emitting layer corresponding to a sub-pixel of the pixel unit; filling the first cavity block with a solution of a hole transport material by soaking technology, solidifying to obtain the hole transport layer, and filling the second cavity block with a solution of an organic light emitting material by soaking technology, solidifying to obtain the organic light emitting layer; transferring the hole transport layer in the first cavity block and the organic light emitting layer in the second cavity block to the substrate sequentially through a transfer carrier; after the above operations, forming an electron transport layer, an electron injection layer and a cathode layer on the substrate.

Optional, in the fabrication method, depths of first cavity blocks respectively corresponding to different sub-pixels of the pixel unit are the same.

Optional, in the fabrication method, depths of second cavity blocks respectively corresponding to different sub-pixels of the pixel unit are the same.

Optional, before filling the first cavity block with the solution of the hole transport material by soaking technology and filling the second cavity block with the solution of the organic light emitting material by soaking technology, the fabrication method further comprises: forming a mold releasing layer in the first cavity block and the second cavity block respectively.

Optional, in the fabrication method, the mold releasing layers are made of a surfactant.

Optional, in the fabrication method, transferring the hole transport layer in the first cavity block and the organic light emitting layer in the second cavity block to the substrate sequentially through a transfer carrier comprising: the first molding substrate and the first transfer carrier are aligned and attached and released, so that the hole transport layer is transferred to the first transfer carrier, the first transfer carrier and the substrate are aligned and attached and the first transfer carrier is peeled off to attach the hole transport layer onto the substrate; the second molding substrate and the second transfer carrier are aligned and attached and released, so that the organic light emitting layer is transferred to the second transfer carrier, the second transfer carrier and the substrate are aligned and attached and the second transfer carrier is peeled off to attach the organic light emitting layer onto the substrate.

Optional, in the fabrication method, the ambient temperature is less than 5° C. when the first transfer carrier and the second transfer carrier are peeled off.

Optional, in the fabrication method, before filling the first cavity block with the solution of the hole transport material by soaking technology and filling the second cavity block with the solution of the organic light emitting material by soaking technology, the fabrication method further comprises mixing the solution of the hole transport material and the solution of the organic light emitting material under vacuum.

Optional, in the fabrication method, the first molding substrate and the second molding substrate are quartz substrates.

Embodiment of the present disclosure further provides an OLED display device and the OLED display device is prepared by the above-mentioned fabrication method.

Embodiment of the present disclosure further provides a display panel, and the display panel comprises the above-mentioned OLED display device.

Embodiment of the present disclosure further provides a display device, and the display device comprises the above-mentioned display panel.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
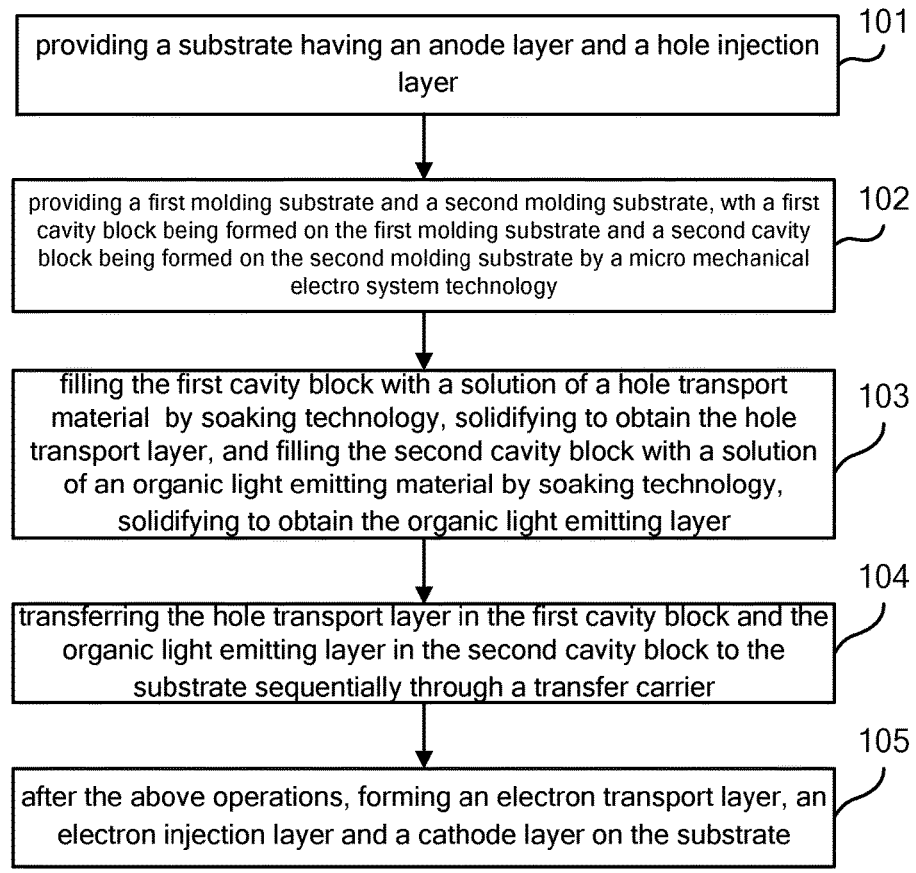
FIG. 1 is a flow diagram of a fabrication method of an OLED display device provided by the embodiment of the present disclosure.
Figure 2:
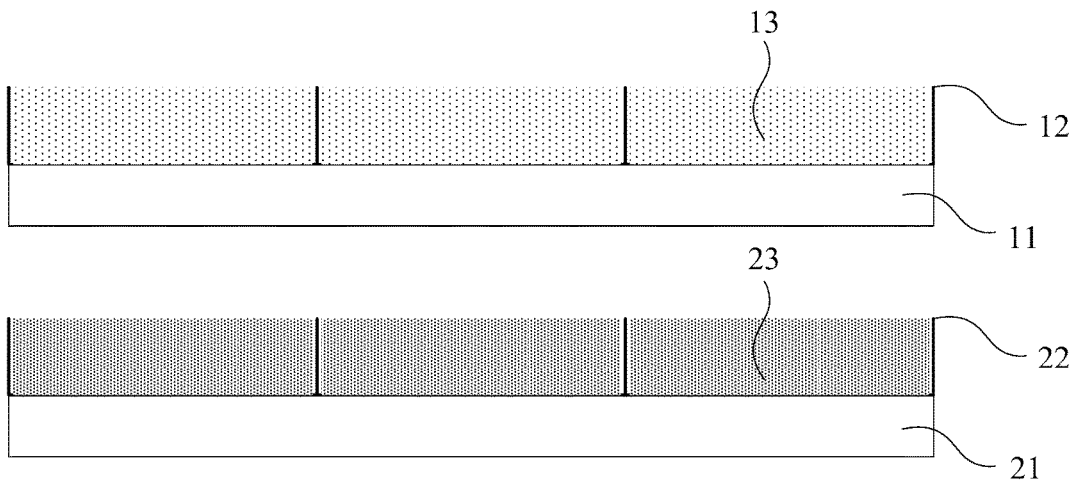
FIG. 2 is a schematic diagram of a section structure of a first molding substrate, a first cavity block, a second molding substrate and a second cavity block provided by the embodiment of the present disclosure.
Figure 3:
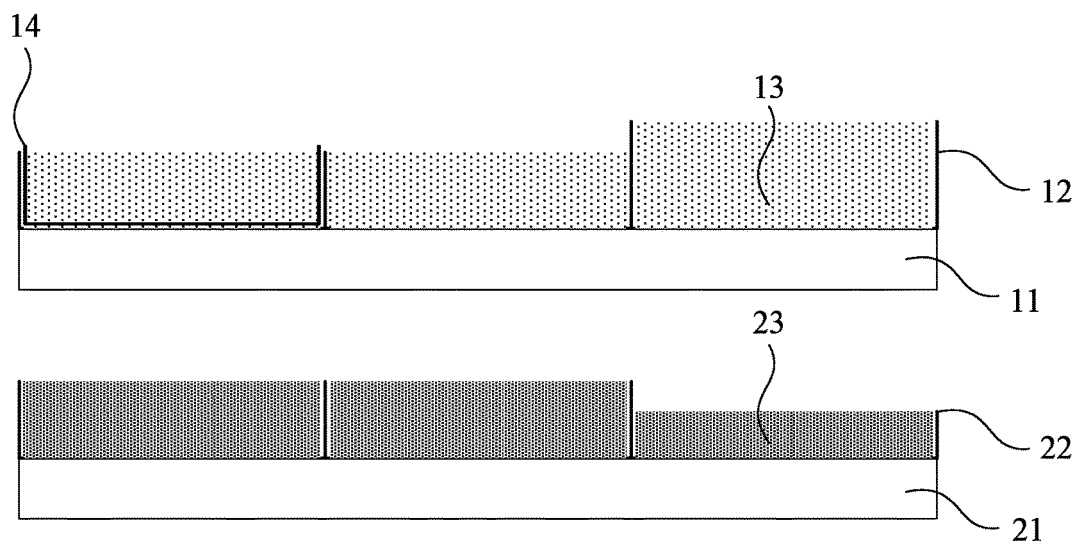
FIG. 3 is a schematic diagram of a section structure of a first molding substrate, a first cavity block, a second molding substrate and a second cavity block provided by another embodiment of the present disclosure.

Refer to FIG. 1, FIG. 2 and FIG. 3, embodiments of the present disclosure provide a fabrication method of an OLED display device, the OLED display device corresponds to a pixel unit, and the method comprises the following steps.

Step 101, providing a substrate having an anode layer and a hole injection layer.

Step 102, providing a first molding substrate 11 and a second molding substrate 21, forming a first cavity block 12 on the first molding substrate 11 and forming a second cavity block 22 on the second molding substrate 21 by a micro electro mechanical system (MEMS) technology, wherein, the first cavity block 12 is configured for preparing a hole transport layer corresponding to a sub-pixel of the pixel unit, and the second cavity block 22 is configured for preparing an organic light emitting layer corresponding to a sub-pixel of the pixel unit.

In the case of the OLED display device, a fineness of the hole transport layer and the organic light emitting layer, especially a fineness of the organic light emitting layer determines a fineness of the OLED display device. The first cavity block and the second cavity block are directed formed on the molding substrates (for example, the first molding substrate and the second molding substrate) through a micro electro mechanical system (MEMS) technology, so the first cavity block and the second cavity block can achieve a better fineness. The first cavity block is used for preparing a hole transport layer corresponding to a sub-pixel of the pixel unit, and the second cavity block is used for preparing an organic light emitting layer corresponding to a sub-pixel of the pixel unit. In the case that the fineness of the first cavity block and the second cavity block is good, correspondingly, a hole transport layer and an organic light emitting layer with better fineness can be obtained, and an OLED display device with good fineness can be obtained.

For example, as shown in FIG. 2, the depths of first cavity blocks 12 respectively corresponding to different sub-pixels of the pixel unit are the same.

Similar, as shown in FIG. 2, the depths of second cavity blocks 22 respectively corresponding to different sub-pixels of the pixel unit are the same.

Step 103, filling the first cavity block 12 with the solution of the hole transport material 13 by soaking technology, solidifying to obtain a hole transport layer, and filling the second cavity block 22 with the solution of the organic light emitting material 23 by soaking technology, solidifying to obtain an organic light emitting layer.

Optional, before the step 103, the method of the embodiment further comprises: as shown in FIG. 3, forming a mold releasing layer 14 in the first cavity block 12 and the second cavity block 22 respectively. The mold releasing layers 14 are made of a surfactant. In the present embodiment, mold releasing layers 14 are formed in the first cavity block 12 and the second cavity block 22 can improve the efficiency of mold releasing.

Step 104, transferring the hole transport layer in the first cavity block 12 and the organic light emitting layer in the second cavity block 22 to the substrate sequentially through a transfer carrier.

For example, the step 104 can be carried out as follows: the first molding substrate and the first transfer carrier are aligned and attached and released, so that the hole transport layer is transferred to the first transfer carrier, the first transfer carrier and the substrate are aligned and attached and the first transfer carrier is peeled off to attach the hole transport layer onto the substrate; the second molding substrate and the second transfer carrier are aligned and attached and released, so that the organic light emitting layer is transferred to the second transfer carrier, the second transfer carrier and the substrate are aligned and attached and the second transfer carrier is peeled off to attach the organic light emitting layer onto the substrate.

Optional, the ambient temperature is less than 5° C. when the first transfer carrier and the second transfer carrier are peeled off.

Step 105, after the above steps, forming an electron transport layer, an electron injection layer and a cathode layer on the substrate.

In the present embodiment, forming a first cavity block for preparing a hole transport layer of a sub-pixel, and forming a second cavity block for preparing an organic light emitting layer of a sub-pixel through a micro electro mechanical system (MEMS) technology, a hole transport layer and an organic light emitting layer with a good fineness can be obtained, and the fineness of the pixel of an OLED display device is improved. When the OLED display device is applied to a display panel, the resolution of the display panel can be improved.

Optional, before filling the first cavity block with the solution of the hole transport material by soaking technology and filling the second cavity block with the solution of the organic light emitting material by soaking technology, the method of the embodiment of the present disclosure further comprises mixing the solution of the hole transport material and the solution of the organic light emitting material under vacuum.

Optional, the first molding substrate and the second molding substrate are quartz substrates, glass substrates etc.

The embodiment of the present disclosure can include at least one of the following beneficial effects: forming a first cavity block for preparing a hole transport layer of a sub-pixel, and forming a second cavity block for preparing an organic light emitting layer of a sub-pixel through a micro electro mechanical system (MEMS) technology, a hole transport layer and an organic light emitting layer with a good fineness can be obtained, and the fineness of the pixel of an OLED display device is improved. When the OLED display device is applied to a display panel, the resolution of the display panel can be improved.

Embodiment of the present disclosure further provides an OLED display device and the OLED display device is prepared by the above-mentioned fabrication method. The OLED display device provided by the present disclosure can include the following components, as shown in FIG. 4: a substrate 1, an anode layer 2, a hole injection layer 3, a hole transport layer 4, an organic light emitting layer 6, an electron transport layer 7, an electron injection layer 8 and a cathode layer 9.

As indicated in the fabrication method of the OLED display device: the depths of first cavity blocks respectively corresponding to different sub-pixels of the pixel unit are the same; and the depths of second cavity blocks respectively corresponding to different sub-pixels of the pixel unit are the same. However, regardless of the complexity of fabrication, as shown in FIG. 3, the depth of each first cavity block 12 corresponding to different sub-pixels of the pixel unit are not exactly the same, i.e. the depths of first cavity blocks respectively 12 corresponding to the sub-pixels of red (R), green (G) and blue (B) are not exactly the same. Similarly, the depths of each second cavity block 22 corresponding to different sub-pixels of the pixel unit are not exactly the same, i.e. the depths of each second cavity block corresponding to the sub-pixels of red (R), green (G) and blue (B) are not exactly the same. This means: the hole transport layer and the organic light emitting layer corresponding to different sub-pixels of the OLED display device are in different positions, and the thickness can be the same or different. A possible structure for the OLED display device is illustrated as follows.

Figure 4:
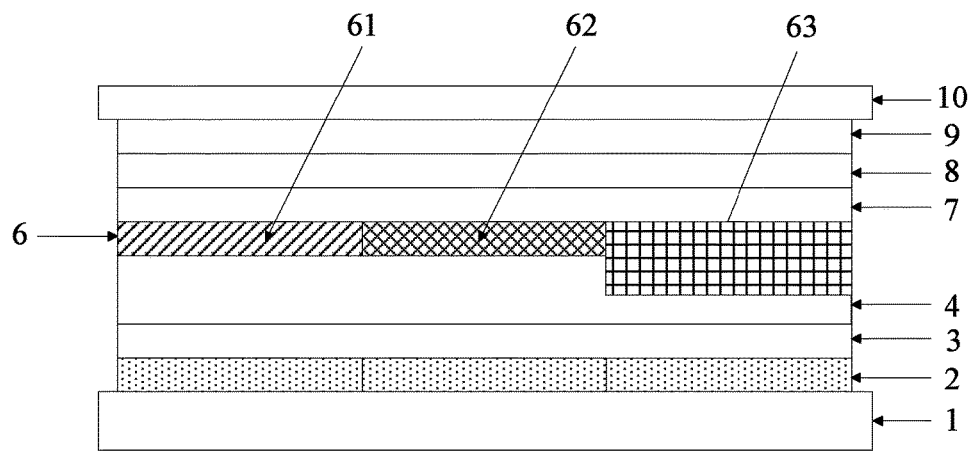
FIG. 4 is a schematic diagram of a structure of the first type of OLED display device provided by the embodiment of the present disclosure.

Referring to FIG. 4, a schematic diagram of a structure of the first type of OLED display device is provided. The OLED display device may include: a substrate 1, an anode layer 2, a hole injection layer 3, a hole transport layer 4, an organic light emitting layer 6, an electron transport layer 7, an electron injection layer 8 and a cathode layer 9. Wherein, the organic light emitting layer 6 corresponds to sub-pixels in different colors, and the organic light emitting layer includes a sub organic light emitting layer 61, a sub organic light emitting layer 62 and a sub organic light emitting layer 63, for example, corresponding to the sub-pixels in red (R), green (g) and blue (b). For example, the thicknesses of the sub organic light emitting layer 61, the sub organic light emitting layer 62 and the sub organic light emitting layer 63 corresponding to different positions of sub-pixels are different. Correspondingly, the thicknesses of the hole transport layer 4 corresponding to the different positions 61, 62, 63 of the sub-pixels are different.

Figure 5:
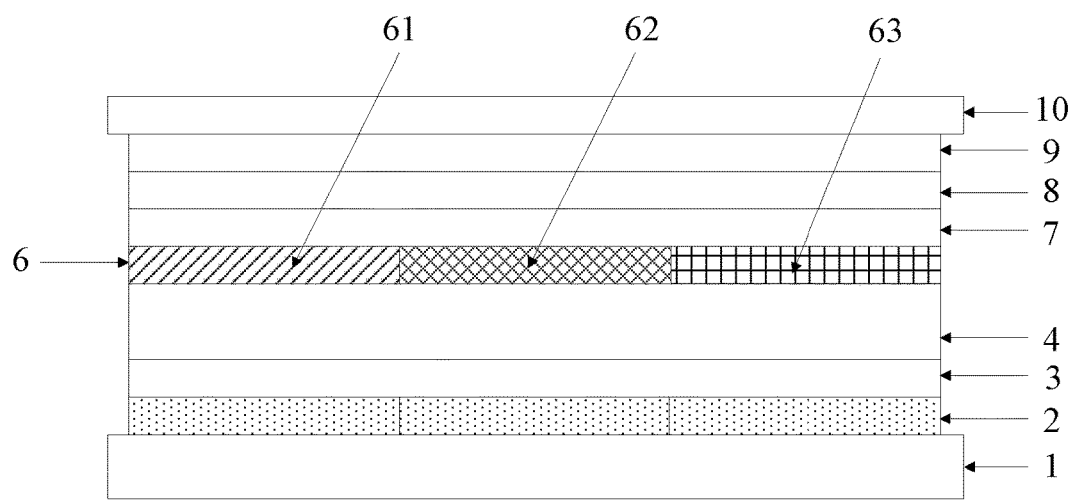
FIG. 5 is a schematic diagram of a structure of the second type of OLED display device provided by the embodiment of the present disclosure.

For example, refer to FIG. 5, a schematic diagram of a structure of the second type of OLED display device is provided. The OLED display device may include: a substrate 1, an anode layer 2, a hole injection layer 3, a hole transport layer 4, an organic light emitting layer 6, an electron transport layer 7, an electron injection layer 8 and a cathode layer 9. Wherein, the organic light emitting layer 6 corresponds to sub-pixels in different colors, and the organic light emitting layer includes a sub organic light emitting layer 61, a sub organic light emitting layer 62 and a sub organic light emitting layer 63, for example, corresponding to the sub-pixels in red (R), green (g) and blue (b). For example, the thicknesses of the sub organic light emitting layer 61, the sub organic light emitting layer 62 and the sub organic light emitting layer 63 corresponding to different positions of sub-pixels are the same. Correspondingly, the thicknesses of the hole transport layer 4 corresponding to the different positions of 61, 62, 63 of the sub-pixels are the same.

It is required that the cathode layer 9 of the OLED display device shown in FIG. 4 and FIG. 5 may include a package cover plate 10. Besides, the OLED display devices shown in FIG. 4 and FIG. 5 are only for illustrative purposes, and the embodiment of the disclosure is not limited to this.

Embodiment of the present disclosure further provides a display panel, and the display panel comprises the above-mentioned OLED display device.

Embodiment of the present disclosure further provides a display device, and the display device comprises the above-mentioned display panel.

The embodiment of the present disclosure can include at least one of the following beneficial effects: forming a first cavity block for preparing a hole transport layer of a sub-pixel, and forming a second cavity block for preparing an organic light emitting layer of a sub-pixel through a micro electro mechanical system (MEMS) technology, a hole transport layer and an organic light emitting layer with a good fineness can be obtained, and the fineness of the pixel of an OLED display device is improved. When the OLED display device is applied to the display panel and the display device, the resolution of the display panel and the display device can be improved.

What are described above is related to the illustrative embodiments of the disclosure only and not limitative to the scope of the disclosure; the scopes of the disclosure are defined by the claims.

The present application claims the priority of the Chinese Patent Application No. 201510355125.0 filed on Jun. 24, 2015, which is incorporated herein by reference as part of the disclosure of the present application.

What is claimed is:

1. A fabrication method of an organic light emitting diode (OLED) display device, wherein the OLED display device corresponds to a pixel unit, and the method comprises:
providing a substrate having an anode layer and a hole injection layer;
providing a first molding substrate and a second molding substrate, with a first cavity block being formed on the first molding substrate and a second cavity block being formed on the second molding substrate by a micro electro mechanical system (MEMS) technology, wherein the first cavity block is configured for preparing a hole transport layer corresponding to a sub-pixel of the pixel unit, and the second cavity block is configured for preparing an organic light emitting layer corresponding to a sub-pixel of the pixel unit
wherein the depth of each first cavity block corresponding to different sub-pixels of the pixel unit are not the same and the depth of each second cavity block corresponding to different sub-pixels of the pixel unit are not the same;
filling the first cavity block with a solution of a hole transport material, solidifying to obtain the hole transport layer, and filling the second cavity block with a solution of an organic light emitting material solidifying to obtain the organic light emitting layer;

transferring the hole transport layer in the first cavity block and the organic light emitting layer in the second cavity block to the substrate sequentially through a transfer carrier; and after the above operations, forming an electron transport layer, an electron injection layer and a cathode layer on the substrate.

2. The fabrication method according to claim 1, before filling the first cavity block with a solution of the hole transport material and filling the second cavity block with the solution of the organic light emitting material, further comprising:

forming a mold releasing layer in the first cavity block and in the second cavity block.

3. The fabrication method according to claim 2, wherein the mold releasing layer is made of a surfactant.

4. The fabrication method according to claim 1, wherein the first molding substrate and a first transfer carrier are aligned and attached, and released, so that the hole transport layer is transferred to the first transfer carrier, the first transfer carrier and the substrate are aligned and attached, and the first transfer carrier is peeled off to attach the hole transport layer onto the substrate;

the second molding substrate and a second transfer carrier are aligned and attached, and released, so that the organic light emitting layer is transferred to the second transfer carrier, the second transfer carrier and the substrate are aligned and attached, and the second transfer carrier is peeled off to attach the organic light emitting layer onto the substrate.

5. The fabrication method according to claim 4, wherein an ambient temperature is less than 5° C. when the first transfer carrier and the second transfer carrier ace peeled off.

6. The fabrication method according to claim 1, before filling the first cavity block with the solution of the hole transport material and filling the second cavity block with the solution of the organic light emitting material, further comprising:

mixing the solution of the hole transport material and the solution of the organic light emitting material are under vacuum.

7. The fabrication method according to claim 1, wherein the first molding substrate and the second molding substrate are quartz substrates.

8. An OLED display device prepared by the fabrication method according to claim 1.

9. A display panel, comprising the OLED display device according to claim 8.

10. A display device, comprising the display panel according to claim 9.

* * * * *